(12) United States Patent
Tsuchi

(10) Patent No.: US 7,696,911 B2
(45) Date of Patent: Apr. 13, 2010

(54) AMPLIFIER CIRCUIT, DIGITAL-TO-ANALOG CONVERSION CIRCUIT, AND DISPLAY DEVICE

(75) Inventor: Hiroshi Tsuchi, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 12/155,653

(22) Filed: Jun. 6, 2008

(65) Prior Publication Data

US 2008/0303700 A1 Dec. 11, 2008

(30) Foreign Application Priority Data

Jun. 8, 2007 (JP) ............................. 2007-153165

(51) Int. Cl.
*H03M 1/00* (2006.01)
(52) U.S. Cl. .......................................... 341/136; 330/9
(58) Field of Classification Search ......... 341/130–155; 330/9, 51, 253; 345/89, 94, 100, 204
See application file for complete search history.

(56) References Cited

U.S. PATENT DOCUMENTS

| | | | |
|---|---|---|---|
| 7,342,527 B2 * | 3/2008 | Tsuchi | 341/144 |
| 7,368,990 B2 * | 5/2008 | Tsuchi | 330/261 |
| 7,369,075 B2 * | 5/2008 | Ishii et al. | 341/144 |
| 7,459,967 B2 * | 12/2008 | Tsuchi et al. | 330/9 |
| 7,508,259 B2 * | 3/2009 | Tsuchi | 330/51 |
| 7,545,305 B2 * | 6/2009 | Tsuchi | 341/144 |
| 7,554,389 B2 * | 6/2009 | Tsuchi et al. | 330/9 |

FOREIGN PATENT DOCUMENTS

JP  59-154820  9/1984

OTHER PUBLICATIONS

McCartney, et al., "A Third Generation Timing Controller and Column Driver Architechture Using Point-to-Point Differential Signaling", Society for Information Display 2004 International Symposium Digest of Technical Papers vol. XXXV pp. 1556-1559.
Bell, M., "An LCD Column Driver Using a Switch Capacitor DAC", IEEE Journal of Solid-State Circuits, vol. 40, No. 12, Dec. 2005, pp. 2756-2765.

* cited by examiner

*Primary Examiner*—Lam T Mai
(74) *Attorney, Agent, or Firm*—McGinn IP Law Group, PLLC

(57) ABSTRACT

Disclosed is a digital-to-analog conversion circuit in which first and second serial DACs and an amplifier circuit for driving a data line are provided. In a first data period, the first serial DAC converts a first digital signal received in the first data period to a first signal, the second serial DAC holds a signal obtained by converting a digital signal received in a data period one period before the first data period, and the amplifier circuit amplifies and outputs the signal held in the second serial DAC, to the data line. In a second data period following after the first data period, the second serial DAC converts the second digital signal received in a second data period, the first serial DAC holds the first signal converted in the first data period, and an amplifier circuit amplifies and outputs the first signal held in the first serial DAC, to the data line.

17 Claims, 10 Drawing Sheets

FIG. 2

| PERIOD | FIRST DATA PERIOD | | | | | | SECOND DATA PERIOD | | | | | |
|---|---|---|---|---|---|---|---|---|---|---|---|---|
| | T11 | T12_B₁ | T13_B₁ | ~ | T12_Bₖ | T13_Bₖ | T21 | T22_B₁ | T23_B₁ | ~ | T22_Bₖ | T23_Bₖ |
| SWITCH 111 | OFF | ON (V1 or V2) | OFF | | ON (V1 or V2) | OFF | OFF | ↑ | ↑ | ↑ | ↑ | ↑ |
| SWITCH 112 | OFF | ↑ | ON | ↑ | ↑ | ON | OFF | ↑ | ↑ | ↑ | ↑ | ↑ |
| SWITCH 113 | ON | OFF | ↑ | ↑ | ↑ | ↑ | OFF | ↑ | ↑ | ↑ | ↑ | ↑ |
| SWITCH 121 | ON | ↑ | ↑ | ↑ | ↑ | ↑ | ON | ↑ | ↑ | ↑ | ↑ | ↑ |
| SWITCH 122 | OFF | ↑ | ↑ | ↑ | ↑ | ↑ | OFF | ↑ | ↑ | ↑ | ↑ | ↑ |
| SWITCH 211 | OFF | ↑ | ↑ | ↑ | ↑ | ↑ | OFF | ON (V1 or V2) | OFF | | ON (V1 or V2) | OFF |
| SWITCH 212 | OFF | ↑ | ↑ | ↑ | ↑ | ↑ | OFF | ↑ | ON | ↑ | ↑ | ON |
| SWITCH 213 | OFF | ↑ | ↑ | ↑ | ↑ | ↑ | ON | OFF | ↑ | ↑ | ↑ | ↑ |
| SWITCH 221 | OFF | ↑ | ↑ | ↑ | ↑ | ↑ | ON | ↑ | ↑ | ↑ | ↑ | ↑ |
| SWITCH 222 | ON | ↑ | ↑ | ↑ | ↑ | ↑ | OFF | ↑ | ↑ | ↑ | ↑ | ↑ |

FIG. 4

| PERIOD | FIRST DATA PERIOD | | | | | | | SECOND DATA PERIOD | | | | | | |
|---|---|---|---|---|---|---|---|---|---|---|---|---|---|---|
| | T11 | T12_B$_1$ | T13_B$_1$ | ~ | T12_B$_K$ | T13_B$_K$ | T21 | T22_B$_1$ | T23_B$_1$ | ~ | T22_B$_K$ | T23_B$_K$ |
| SWITCH 311 | OFF | ON (V1 or V2) | OFF | | ON (V1 or V2) | OFF | OFF | ON (V1 or V2) | OFF | | ON (V1 or V2) | OFF |
| SWITCH 112 | OFF | ↑ | ON | | OFF | ON | OFF | ↑ | ↑ | ↑ | ↑ | ↑ |
| SWITCH 113 | ON | OFF | ↑ | ↑ | ↑ | ↑ | OFF | ↑ | ↑ | ↑ | ↑ | ↑ |
| SWITCH 121 | ON | ↑ | ↑ | ↑ | ↑ | ↑ | ON | ↑ | ↑ | ↑ | ↑ | ↑ |
| SWITCH 122 | OFF | ↑ | ↑ | ↑ | ↑ | ↑ | ON | ↑ | ↑ | ↑ | ↑ | ↑ |
| SWITCH 212 | OFF | ↑ | ↑ | ↑ | ↑ | ↑ | OFF | OFF | ON | | OFF | ON |
| SWITCH 213 | OFF | ↑ | ↑ | ↑ | ↑ | ↑ | ON | ↑ | ↑ | ↑ | ↑ | ↑ |
| SWITCH 221 | OFF | ↑ | ↑ | ↑ | ↑ | ↑ | ON | ↑ | ↑ | ↑ | ↑ | ↑ |
| SWITCH 222 | ON | ↑ | ↑ | ↑ | ↑ | ↑ | OFF | ↑ | ↑ | ↑ | ↑ | ↑ |

FIG. 6

| PERIOD | FIRST DATA PERIOD | SECOND DATA PERIOD |
|---|---|---|
| SWITCH 121 | ON | OFF |
| SWITCH 122, 123 | OFF | ON |
| SWITCH 221 | OFF | ON |
| SWITCH 222, 223 | ON | OFF |

AMPLIFIER CIRCUIT, DIGITAL-TO-ANALOG CONVERSION CIRCUIT, AND DISPLAY DEVICE

REFERENCE TO RELATED APPLICATION

This application is based upon and claims the benefit of the priority of Japanese patent application No. 2007-153165 filed on Jun. 8, 2007, the disclosure of which is incorporated herein in its entirety by reference thereto.

TECHNICAL FIELD

The present invention relates to an amplifier circuit and a digital-to-analog conversion circuit, and in particular, to an amplifier circuit and digital-to-analog conversion circuit preferably applied to a data driver, and to a data driver and display device.

BACKGROUND

Recently, as display devices, liquid crystal display (LCD) devices that feature thinness, lightweight, lower power dissipation have been widespread used, and have been extensively utilized as display units of mobile devices including portable telephone apparatuses (such as mobile phones or cellular phones), PDAs (personal digital assistants), and notebook PCs. Recently, however, a technology for supporting a larger screen and a moving image of the liquid crystal display devices has been developed. Then, realization of tabletop large-screen display devices and tabletop large-screen liquid crystal TVs as well as display devices and TVs for mobile use have become possible. As these liquid crystal display devices, an active matrix driving system liquid crystal display device capable of performing high-definition display is employed. Referring to FIG. 9, a typical configuration of the active matrix driving system liquid crystal display device will be outlined. FIG. 9 schematically shows a main configuration connected to one pixel in a liquid crystal display unit, using an equivalent circuit.

Generally, a display unit 960 of the active matrix driving liquid crystal display device includes a semiconductor substrate, an opposing substrate, and a liquid crystal sealed in between these two substrates by opposing these two substrates. On the semiconductor substrate, there are arranged transparent pixel electrodes 964 and a thin film transistor (TFT) 963 in a matrix form (for example, for a color SXGA panel, 1280×3 pixel columns×1024 pixel rows).

Turning on and off of a TFT 963 having a switching function is controlled by a scan signal. When the TFT 963 is turned on, a gray scale voltage corresponding to a video signal is applied to a corresponding pixel electrode 964. Transmittance of the liquid crystal is changed by a potential difference between each pixel electrode 964 and the opposing substrate electrode 966, and the potential difference is held by a liquid crystal capacitance 965 for a certain period, thereby displaying an image. On the semiconductor substrate, transparent pixel electrodes 964 and thin-film transistors (TFTs) 963 are arranged in a matrix form (of 1280×3 pixel rows×1024 pixel columns in the case of a color SXGA panel, for example). One transparent electrode 966 is formed on an entire surface of the opposing substrate.

On the semiconductor substrate, data lines 962 and scan lines 961 are wired in the form of a grid (in which 1280×3 data lines and 1024 scan lines are arranged in the case of the color SXGA panel described above). A data line 962 sends a plurality of level voltages (gray scale voltages) applied to each pixel electrode 964, and a scan line 961 sends the scan signal. Due to a capacitance produced at an intersection between each of the scan lines 961 and each of the data lines 962 and a liquid crystal capacitance sandwiched between the semiconductor substrate and the opposing substrate, the scan lines 961 and the data lines 962 each have become a large capacitive load.

The scan signal is supplied to a scan line 961 from a gate driver 970, and a gray scale voltage is applied to each pixel electrode 964 from a data driver 980 through a data line 962. The gate driver 970 and the data driver 980 are controlled by a display controller 950. The necessary clock CLK, control signals, and the like, are respectively supplied by the display controller 950, and image data is supplied to the data driver 980. At present, digital data is predominantly used for image data.

Rewriting of data of one screen is usually performed in one frame period (of approximately 1/60 seconds). Data is successively selected every pixel row (every line) by each scan line, and a gray scale voltage is supplied from each data line within a selection period.

While the gate driver 970 should supply the scan signal of at least two values, the data driver 980 needs to drive a data line by the gray scale voltage of multi-valued levels corresponding to the number of gray scales. For this reason, the data driver 980 includes digital-to-analog conversion circuit which includes a digital-to-analog converter (DAC) for converting image data to grayscale signal voltage, and an amplifier circuit which amplifies and outputs to the data lines 962 the grayscale signal voltage.

Recently, image quality of liquid crystal display devices has been improved (or the number of colors used in the liquid crystal display devices has been increased). There has been a growing demand for at least 260 thousand colors (video data of six bits for each of colors of R, G, B) and 26,800 thousand colors (video data of eight bits for each of the colors of R, G, B) or more. For this reason, in data drivers which output grayscale signal voltage corresponding to multi-bit image data, the circuit scale of the DAC increases, and as a result, the chip area of a data driver LSI increases, which is a factor that leads to high cost. In addition as high resolution of liquid crystal display devices advances together with larger screens, load capacitance of the data lines 962 increases considerably, and 1 data selection period (1-data output period), which is approximately equivalent to 1 frame period divided by number of gate lines, becomes shorter. An amplifier circuit serving as an output buffer of a driver LSI chip must drive a large capacitive load at high speed with a high voltage accuracy in a short 1-data selection period.

As a low area DAC that converts multi-bit digital data into an analog voltage signal, a serial DAC is known in which a reference voltage is sequentially sampled according to digital data inputted in a time-serial manner, and level voltages are obtained by repeating charge distribution among capacitors.

FIG. 10 is a diagram showing an example of a configuration of a digital-to-analog conversion circuit provided with a serial DAC described in Patent Document 1, mentioned below. Meanwhile, the present specification, a circuit block that converts a digital signal into an analog signal is denoted as a DAC (Digital-to-Analog Converter), and is distinguished from a configuration which includes a DAC and an amplifier circuit that amplifies an output of the DAC, which is denoted as a digital-to-analog conversion circuit.

The digital-to-analog conversion circuit of FIG. 10 includes a serial DAC that includes voltage supply terminals N5 and N6 supplied with two reference voltages V5 and V6, respectively, a capacitor C91 that has a first terminal connected to the voltage supply terminal N5, and a second terminal connected to a terminal N51, a capacitor C92 that has a first terminal connected to the voltage supply terminal N5, and a second terminal connected to a terminal N52, a changeover switch 911 that switches connection of the terminal 51 to the voltage supply terminal N5 or N6, a switch 912 that is connected between the terminal N51 and N52, a switch 913 that is connected between the terminal N52 and the voltage supply terminal N5, and a voltage follower circuit 919 that is composed by a differential amplifier which has a non-inverting input end (+) and an inverting input end (−) connected to the terminal N52 and an output terminal, respectively. Meanwhile, capacitance values of the capacitors C91 and C92 are normally configured to be equal.

The operation of the digital-to-analog conversion circuit of FIG. 10 will now be described. First, the switch 913 is temporarily turned ON, and potential difference (inter-terminal voltage) between the two ends (N5 and N52) of the capacitor C92 is reset to zero.

Next, either of the reference voltages V5 or V6 is sampled at the terminal N51 by the changeover switch 911, in accordance with a value of lowest bit data $B_1$ of digital data ($B_1$-$B_K$) received in a time serial manner, and then after, the changeover switch 911 is turned OFF (open). The switch 912 is turned ON and charge redistribution occurs between the capacitors C91 and C92. Then the switch 912 is turned OFF and the charge is held in the capacitor C92.

Continuing to this, either of the reference voltages V5 or V6 is sampled at the terminal N51 by the changeover switch 911, according to next bit data $B_2$, and after charge redistribution occurs between the capacitors C91 and C92 by the switch 912, the redistributed charge is held in the capacitor C92.

In the same way, sample and hold operations are repeated in order from lower bit data to higher bit data.

In cases of K bit data, one cycle of sampling and holding is repeated K times, and the voltage of the terminal N52 at this time is expressed by the following formula (1).

$$V_{N52}=(2^{-1} \times B_K+2^{-2} \times B_{K-1}+\ldots+2^{-K} \times B_1) \times (V6-V5)+V5 \qquad (1)$$

where $B_K, B_{K-1}, \ldots, B_1$ are 0 or 1.

Voltage $V_{N52}$ is amplified and outputted as Vout by the voltage follower circuit 919. In this way, the digital-to-analog conversion circuit of FIG. 10 can output each voltage level obtained by dividing an interval between the reference voltage V5 and V6 equally into $2^K$, in accordance with K bit data.

The digital-to-analog conversion circuit of FIG. 10 is featured in that, since the number of elements does not depend on the number of bits of the data, circuit size can be made very small (area saving) for the configuration of large number of bits.

However, the output voltage of the digital-to-analog conversion circuit of FIG. 10, is a liner in which voltage levels each are equally spaced, and with such, it is not possible to output a grayscale voltage matching the non-linear gamma characteristic of liquid crystal.

In this regard, recently in Non-Patent Document 1, there is disclosed a method of configuring a DAC to enable linear output several times the number of grayscale voltages necessary for output, and, among multiple linear output levels thereof, grayscale voltages matching the non-linear gamma characteristic of liquid crystal are allocated.

In this method, the number of bits corresponding to the number of grayscale voltages actually outputted is increased by approximately 2 or 3 bits. Therefore, the digital-to-analog conversion circuit as in FIG. 10 which does not depend on the number of bits is preferable.

[Patent Document 1]
JP Patent Kokai Publication No. JP-A-59-154820A (FIG. 1)

[Non Patent Document 1]
SOCIETY FOR INFORMATION DISPLAY 2004 INTERNATIONAL SYMPOSIUM DIGEST OF TECHNICAL PAPERS VOLUME XXXV pp. 1556-1559

[Non Patent Document 2]
IEEE JOURNAL OF SOLID-STATE CIRCUITS, VOL. 40, NO. 12, DECEMBER 2005, pp. 2756-2765

SUMMARY OF THE DISCLOSURE

The entire disclosures of Patent Document 1, Non-Patent Documents 1 and 2 are incorporated herein by reference thereto. The following analysis is given by the present invention.

The digital-to-analog conversion circuit of FIG. 10 enables small area for many bits. However, according to examination results by the present inventor, there is a problem in that it is difficult for this digital-to-analog conversion circuit to perform high speed drive of a capacitive load (data line 962) connected to an output terminal, to a voltage signal level in accordance with digital data.

As a characteristic of operation of the digital-to-analog conversion circuit of FIG. 10, the cycle number equal to the number of bits (K) of the digital data is required for converting the digital data into corresponding level voltage signal. Furthermore, since the larger the number of bits the smaller the voltage difference between grayscales, the high voltage accuracy is required, time required for the cycle operation for the digital-to-analog conversion becomes more elengated. Therefore, if this cycle operation period, that is, a digital-to-analog conversion period (hereinafter referred to as "DA conversion period"), is provided in one data period, a problem occurs in that a drive period allocated for the voltage follower circuit 919 to drive an output voltage to a target level, is substantially reduced due to the elongated DA conversion period.

Therefore, it is difficult to apply the circuit configuration of FIG. 10 to a data driver of a large-screen, high definition display device in which data line load capacitance is large and one data output period is short.

Accordingly, it is an object of the present invention to provide a digital-to-analog conversion circuit which can keep a drive period allocated for outputting a target voltage level from decreasing due to a DA conversion period.

Another object of the present invention is to provide a digital-to-analog conversion circuit in which increase in circuit area and current consumption can be suppressed.

A further object of the present invention is to provide a data driver and a display device in which high quality is realized in a high definition display with a large screen that accommodates many bits.

According to an aspect of the present invention, there is provided an amplifier circuit comprising: first and second differential stages; and an amplifier stage that, responsive to output signals of the first and second differential stages, performs charging or discharging drive operation of an output terminal of said amplifier circuit. A first input of an input pair of said first differential stage is supplied with a first signal, a first input of an input pair of said second differential stage is supplied with a second signal, the first signal or a feedback signal from said output terminal is switched and supplied to a second input of the input pair of said first differential stage, and the second signal or the feedback signal from said output terminal is switched and supplied to a second input of the input pair of said second differential stage.

In the amplifier circuit according to the present invention, the first differential stage includes a first differential pair; the second differential stage includes a second differential pair; and the amplifier circuit comprises a load circuit to which output pairs of said first and second differential pairs are connected in common, at least one output of the commonly connected output pairs of said first and second differential pairs is connected to an input of said amplifier stage.

In the amplifier circuit according to the present invention, the first differential stage comprises: a first differential pair; and a first load circuit connected to an output pair of the first differential pair. The second differential stage comprises: a second differential pair; and a second load circuit connected to an output pair of the second differential pair. At least one output of the output pair of the first differential pair or at least one output of the output pair of the second differential pair may be switched and supplied to an input of the amplifier stage. There may be provided a first switch inserted between the input of the amplifier stage and at least one output of an output pair of the first differential pair; and a second switch inserted between the input of the amplifier stage and at least one output of an output pair of the second differential pair.

In the amplifier circuit according to the present invention, when the first signal and the feedback signal from the output terminal are respectively supplied to the first and second inputs of the input pair of the first differential pair, the second signal is supplied in common to the first and second inputs of the second differential pair.

In the amplifier circuit according to the present invention, when the second signal and the feedback signal from the output terminal are respectively supplied to the first and second inputs of the input pair of the second differential pair, the first signal is supplied in common to the first and second inputs of the first differential pair.

The amplifier circuit according to the present invention may be configured such that, when the feedback signal from the output terminal is supplied to the second input of the input pair of the first differential pair, the second signal is supplied to the second input of the input pair of the second differential pair, and when the feedback signal from the output terminal is supplied to the second input of the input pair of the second differential pair, the first signal is supplied to the second input of the input pair of the first differential pair.

In the amplifier circuit according to the present invention, there are provided a first switch inserted between the output terminal and the second input of the input pair of said first differential stage; a second switch inserted between the first input and the second input of the input pair of said first differential stage; a third switch inserted between the output terminal and the second input of the input pair of said second differential stage; and a fourth switch inserted between the first input and the second input of the input pair of said second differential stage.

According to another aspect of the present invention, there is provided a digital-to-analog conversion circuit including: the amplifier circuit according to the present invention above described; and first and second serial DACs (digital-to-analog converters) which respectively convert and output the first and second signals, in response to first and second digital signal received time serially.

In the digital-to-analog conversion circuit according to the present invention, in a first data period, the first serial DAC converts the first digital signal received in the first data period into the first signal; the second serial DAC holds a signal obtained by converting a digital signal received in a data period one period before the first data period; the amplifier circuit amplifies and outputs the signal held in said second serial DAC at said output terminal. In a second data period following after the first data period, the second serial DAC converts the second digital signal received in the second data period into the second signal; the first serial DAC holds the first signal converted in the first data period; and the amplifier circuit amplifies and outputs the first signal at said output terminal.

In the digital-to-analog conversion circuit according to the present invention, at least one of the first and second serial DACs comprises: a changeover switch that the changes over the connection of an output end to one of a first potential terminal and a second potential terminal, in accordance with a value of each bit of a received digital signal; a first capacitor connected between the output end of the changeover switch and the first potential terminal; a first switch that has one end connected to the output end of the changeover switch; a second capacitor that is connected between another end of the first switch and the first potential terminal; and a second switch connected between terminals of the second capacitor.

In the digital-to-analog conversion circuit according to the present invention, the first serial DAC comprises: a changeover switch that changes over the connection of an output end to one of a first potential terminal and a second potential terminal, in accordance with a value of each bit of a received digital signal; a first capacitor that is connected between the output end of the changeover switch and the first potential terminal; a first switch that has one end connected to the output end of the changeover switch; a second capacitor that is connected between another end of the first switch and the first potential terminal; and a second switch that is connected between terminals of the second capacitor.

The second serial DAC comprises: a third switch that has one end connected to the output end of the changeover switch; a third capacitor that is connected between another end of the third switch and the first potential terminal; and a fourth switch that is connected between terminals of the third capacitor.

A data driver according to another aspect of the present invention includes a digital-to-analog conversion circuit according to the invention as described above. In more detail, the data driver comprises: a serial-to-parallel conversion and latch circuit; a reference voltage generation circuit; a plurality of digital-to-analog conversion circuits; a plurality of output switch circuits; and a control signal generation circuit that generates control signals necessary for said circuits.

The serial-to-parallel conversion and latch circuit receives at least an input digital data signal and a control signal from the control signal generation circuit, perform conversion of serialized data to parallel data in association with an output number, performs bitwise latching, and outputs the latched data signals to said digital-to-analog conversion circuits in a bitwise manner.

As the digital-to-analog conversion circuits, there are provided digital-to-analog conversion circuits corresponding to a first polarity and a second polarity, respectively. The digital-to-analog conversion circuit of the first polarity, receives first and second reference voltages generated by the reference voltage generation circuit, and converts and outputs a voltage signal of the first polarity in accordance with a data signal sequentially output bit by bit from said serial-to-parallel conversion and latch circuit.

The digital-to-analog conversion circuit of the second polarity, receives third and fourth reference voltages generated by the reference voltage generation circuit, and converts and outputs a voltage signal of the second polarity in accordance with a data signal sequentially output bit by bit from the serial-to-parallel conversion and latch circuit.

The digital-to-analog conversion circuit of the first polarity and the digital-to-analog conversion circuit of the second polarity each comprise the digital-to-analog conversion circuit of the invention described above.

The first and second reference voltage are supplied to the first and second potential terminals of the digital-to-analog conversion circuit of the first polarity; and the third and the fourth reference voltage are supplied to the first and second potential terminals of the digital-to-analog conversion circuit of the second polarity.

The output switch circuit switches the voltage signal of the first polarity and the voltage signal of the second polarity output from the digital-to-analog conversion circuit, based on the control signals from the control signal generation circuit, to first and second driver output terminals at prescribed timing.

A display device according to another aspect of the present invention is supplied with a data driver according to the invention described above.

According to another aspect of the present invention, there is provided a digital-to-analog conversion apparatus comprising:

first and second DACs (digital-to-analog converters) which alternately switch operation in such a way that one of the first and second DACs performs digital-to-analog conversion and the other of the first and second DAC holds an analog voltage converted by the one; and an amplifier circuit including first and second differential circuits in which switching control is performed such that when one of the first and second differential circuits has a voltage follower configuration in which an output terminal of said digital-to-analog conversion apparatus is feedback connected to an inverting input end of said one differential circuit, a common-mode signal is supplied to an inverting input end and a non-inverting input end of the other one of the first and second differential circuits. When one of first and second differential circuits has a voltage follower configuration, a converted analog voltage is supplied from associated one of the first and second DACs to a non-inverting input end of said one differential circuit, and digital-to-analog conversion is carried out by the other DAC of the first and second DACs corresponding to the other one of the first and second differential circuits, an inverting input end and a non-inverting input end of the other differential circuit being supplied with a common mode signal.

In the present invention, when said one differential circuit has a voltage follower configuration, an output signal of the other DAC, in which digital-to-analog conversion is performed, is supplied in common to the inverting input end and the non-inverting input end of the other differential circuit, as the common mode signal.

According to further aspect of the present invention, there is provided an apparatus comprising: first and second sample and hold circuits which alternately switch operation such that when one of the first and second sample and hold circuits performs an operation of sampling an input signal, the other of the first and second sample and hold circuits performs an operation of holding the sampled signal; and first and second differential circuits in which switching control is performed such that when one of the first and second differential circuits has a voltage follower configuration in which an output terminal of the amplifier apparatus is feedback connected to an inverting input end of said one of the first and second differential circuits, a common-mode signal is supplied to an inverting input end and a non-inverting input end of the other one of the first and second differential circuits. When one of the first and second differential circuits has a voltage follower configuration, a signal held by an associated one of the first and second sample and hold circuits is supplied to the non-inverting input end of said one of the first and second differential circuits, and a sampling operation is performed in the other one of the first and second sample and hold circuits corresponding to the other one of the first and second differential circuits, an inverting input end and a non-inverting input end of the other one of the first and second differential circuits being supplied with a common-mode signal.

In the present invention, when said one sample and hold circuit has a voltage follower configuration, an output signal of the other sample and hold circuit in which a sampling operation is performed is supplied in common to an inverting input end and a non-inverting input end of the other differential circuit, as the common mode signal.

The meritorious effects of the present invention are summarized as follows.

According to the present invention, it is possible to provide a digital-to-analog conversion circuit which can keep a drive period for outputting a target voltage signal from decreasing due to DA conversion period.

According to the present invention, it is possible to suppress the increase circuit area and current consumption, while realizing the abovementioned effect.

According to the present invention, by providing a digital-to-analog converter as a data driver, it is possible to provide a data driver and a display device in which high quality is realized in a high definition display with a large screen that accommodates many bits.

Still other features and advantages of the present invention will become readily apparent to those skilled in this art from the following detailed description in conjunction with the accompanying drawings wherein examples of the invention are shown and described, simply by way of illustration of the mode contemplated of carrying out this invention. As will be realized, the invention is capable of other and different examples, and its several details are capable of modifications in various obvious respects, all without departing from the invention. Accordingly, the drawing and description are to be regarded as illustrative in nature, and not as restrictive.

BRIEF DESCRIPTIONS OF THE DRAWINGS

FIG. 1 shows a configuration of a first example of the present invention.

FIG. 2 explains a switch control operation of the first example of the present invention.

FIG. 3 shows a configuration of a second example of the present invention.

FIG. 4 explains a switch control operation of the second example of the present invention.

FIG. 5 shows a configuration of a third example of the present invention.

FIG. 6 explains a switch control operation of the third example of the present invention.

PREFERRED MODES OF THE INVENTION

Figure 1:
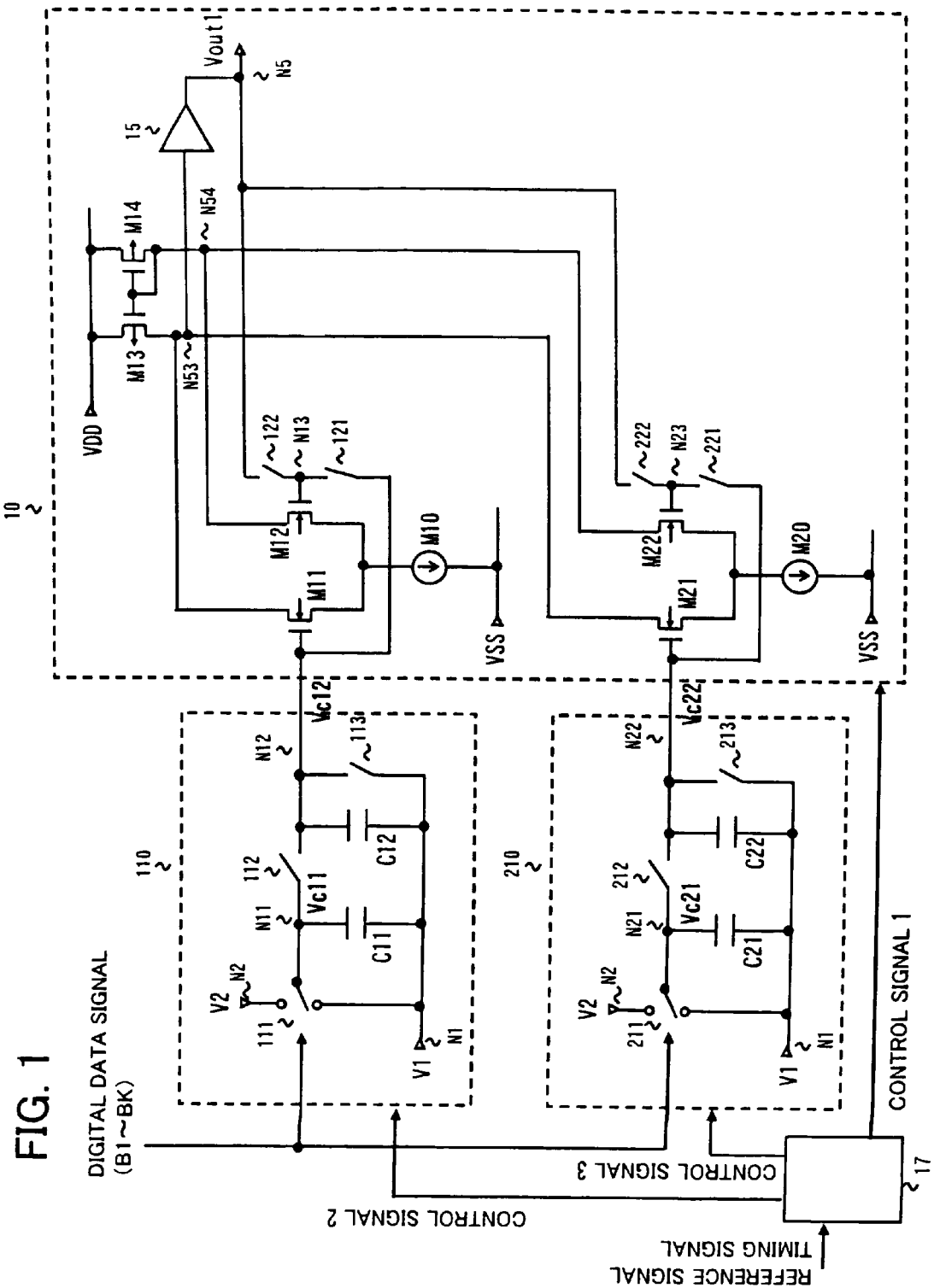

In a digital-to-analog conversion circuit according to one mode of the present invention, there are provided first and second serial DACs (110, 210) and an amplifier circuit (10), for an associated data line that is connected to an output terminal of the digital-to-analog conversion circuit. In a first data period, the first serial DAC (110) converts a first digital signal received in the first data period, into a first signal, the second serial DAC (210) holds a signal obtained by converting a digital signal supplied in a data period one period before the first data period, and the amplifier circuit (10) amplifies and outputs the signal held in the second serial DAC (210), to the data line.

In a second data period following the first data period, the second serial DAC (210) converts a second digital signal received in the second data period, into a second signal, the first serial DAC (110) holds the first signal converted in the first data period, and the amplifier circuit (10) amplifies and outputs the first signal held in the first serial DAC (110), to the data line. In the present invention, a conversion operation of converting a digital signal formed of a bit string serially supplied to one DAC, into a voltage signal, and an amplification output of a voltage that has already been converted in another DAC are interleaved.

That is, according to the present invention, by arranging a DA conversion period, in which the digital signal is converted to a target voltage signal, in a data period preceding to a data period in which the data line is driven to a target voltage, a drive period in the data period in which the data line is driven to a target voltage is not reduced due to the DA conversion period. As a result, a large capacitance data line can also be adequately driven. Meanwhile, the first and second serial DACs (110 and 210) may be replaced by a sample and hold circuit. The DA conversion period corresponds to a serial DAC cycle period or a sampling period of the sample and hold circuit.

In the present invention, the amplifier circuit may includes first and second differential stages which receive output signals of the first and second serial DACs, respectively, and an amplifier stage that is common to the first and second differential stages. The amplifier stage amplifies outputs of the first and second differential stages at different timing (different data periods) and outputs to a data line. One of the first and second differential stages has a voltage follower configuration which receives an output of an associated serial DAC (one of the first and second serial DACs) at a non-inverting input end and an output of the amplifier stage which is fed back at an inverting input end; and the other of the first and second differential stages has a configuration in which receives an output of another associated serial DAC (the other of the first and second serial DACs) in common at the inverting input end and the non-inverting input end, as a common-mode signal. In the present invention, by sharing the amplifier stage between the first and second differential stages, it is possible to suppress the increase in area of the amplifier stage, and to suppress the increase in power dissipation. More detailed description of the invention will be given on the basis of specific examples as below.

Example 1

FIG. 1 is a diagram showing a configuration of a digital-to-analog conversion circuit of an example of the present invention. Referring to FIG. 1, the digital-to-analog conversion circuit of the present example includes an amplifier circuit 10, first and second serial DACs 110 and 210, and a control signal generation circuit 17.

The control signal generation circuit 17 is supplied with A reference signal CLK and a timing signal to generate, based at least the two signals, a control signal 1, a control signal 2, and a control signal 3, which are respectively outputted to the amplifier circuit 10, and first and second serial DACs 110 and 210.

The amplifier circuit 10 includes a first NMOS differential pair (M11 and M12) and a second NMOS differential pair (M21 and M22). Output pairs of the first and second differential pairs are connected in common. A current source M10 is connected between coupled sources of the first differential pair (M11 and M12) and a low potential power supply VSS, and a current source M20 is connected between coupled sources of the second differential pair (M21 and M22) and the low potential power supply VSS.

A PMOS current mirror (M13 and M14) as a load circuit is connected between a high potential power supply VDD and an output pair (nodes N53 and N54). The PMOS current mirror (M13 and M14) is connected in common to the first differential pair (M11 and M12) and the second differential pair (M21 and M22).

An amplifier stage 15 is connected between an output terminal N5 and one end (node N53) of a connection node pair of the load circuit (M13 and M14) and the output pair (nodes N53 and N54). The amplifier stage 15 receives a voltage signal of one end (node N53) of the connection node pair and amplifies the voltage signal to output the resultant signal to the output terminal N5.

There is provided a switch 121 which is connected between a first input (gate of M11) and a second input (gate of M12), being an input pair of the first differential pair (M11 and M12). Also provided is a switch 122 which is connected between the output terminal N5 and a second input of the first differential pair (M11 and M12).

There are also provided a switch 221 which is connected between a first input (gate of M21) and a second input (gate of M22) of the second differential pair (M21 and M22), and a switch 222 which is connected between the output terminal N5 and a second input of the second differential pair (M21 and M22).

First and second voltage signals Vc12 and Vc22 are supplied to a first input of said first and second differential pairs (M11 and M12) and (M21 and M22), respectively.

The amplifier circuit 10 outputs, as Vout1, an output signal in accordance with one of first and second voltage signals supplied respectively to said first and second differential pairs (M11 and M12) and (M21 and M22), by ON-OFF control of the switches 121, 122, 221, and 222 by a control signal 1.

In the amplifier circuit 10, the load circuit and output stage are shared by said first and second differential pairs (M11 and M12) and (M21 and M22). In comparison to a case in which a load circuit and an output stage are provided for each of said first and second differential pairs (M11 and M12) and (M21 and M22), reduction of the number of elements (reduction in area) and low power dissipation are made possible.

The operation of the amplifier circuit 10 shown in FIG. 1, referring to FIG. 2 will be described. FIG. 2 shows control of each switch in 2 data periods: a first data period in which the amplifier circuit 10 performs an output operation in response to a second voltage signal Vc22, and a second data period in which an output operation is performed in response to a first voltage signal Vc12. An arrow symbol → in the drawing indicates continuity of a state (ON or OFF) of a previous period.

In the first data period, the switches 121, 122, 221, and 222 are set to ON, OFF, OFF, and ON states, respectively. At this time, the first differential pair (M11 and M12) has the first and second inputs of the input pair of the differential pair connected and a first voltage signal Vc12 is supplied to each. In this way, the first differential pair (M11 and M12) have a common mode input, output signals of the output pair of the first differential pair (M11 and M12) are constant, not depending on potential of the voltage signal Vc12, and do not contribute to an output voltage Vout1. In the second differential pair (M21 and M22), the second voltage signal Vc22 is supplied to the first input (gate of M21), and the second input (gate of M22) is connected to the output terminal N5.

With such a configuration, the amplifier circuit 10 is a voltage follower for the second differential pair (M21 and M22), and the second voltage signal Vc22 is amplified and outputted, as the output voltage Vout1.

In the second data period, the switches 121, 122, 221, and 222 are set to OFF, ON, ON, and OFF states, respectively.

At this time, in the second differential pair (M21 and M22), the input pair of the first and second inputs is connected, and a second voltage signal Vc22 is supplied to the first and second inputs. In this way, the second differential pair (M21 and M22) have a common mode input, output signals of the output pair of the second differential pair (M21 and M22) are constant, not depending on potential of the second voltage signal, and do not contribute to the output voltage Vout1. On the other hand, in the first differential pair (M11 and M12), the first voltage signal Vc21 is supplied to the first input (gate of M11), and the second input (gate of M21) is connected to the output terminal N5. In this way, the amplifier circuit 10 is a voltage follower for the first differential pair (M11 and M12), and the first voltage signal Vc21 is amplified and output, as the output voltage Vout1.

Next, an explanation is given below concerning the first and second serial DACs 110 and 210.

Figure 10:
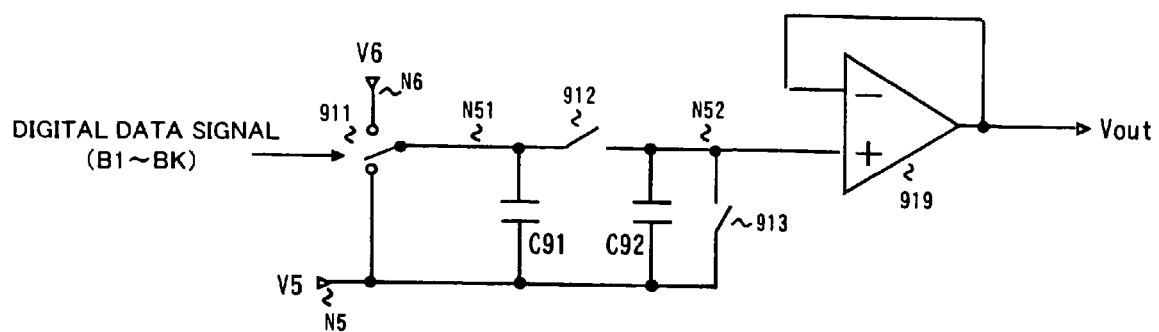
FIG. 10 shows a configuration of a DAC of JP Patent Kokai Publication No. JP-A-59-154820.

Each of the first and second serial DACs 110 and 210 is equivalent to a configuration in which the voltage follower circuit 919 is removed from a configuration of FIG. 10 (however, reference numbers are different).

The first serial DAC 110 receives a K-bit digital data signal ($B_1$-$B_K$) and a control signal 2 as inputs, and outputs an analog voltage signal Vc12 from a terminal N12.

Specifically, the first serial DAC 110 receives 2 reference voltages V1 and V2 respectively supplied to the voltage supply terminals N1 and N2, and is configured from 2 capacitors C11 and C12, having a first terminal connected to a voltage supply terminal N1, and a second terminal connected to each of terminals N11 and N12, a changeover switch 111 that switches and connects the terminal N11 to the voltage supply terminal N1 or N2, a switch 112 connected between the terminals N11 and N12, and a switch 113 connected between the terminal N12 and the voltage supply terminal N1. The terminal N12 is connected to a first input (gate of M11) of the first differential pair (M11 and M12) of the amplifier circuit 10. Meanwhile, capacitance values of the capacitors C11 and C12 are configured to be equal.

The second serial DAC 210 has a k-bit digital data signal ($B_1$-$B_K$) and a control signal 3 as inputs, and outputs an analog voltage signal Vc22 from the terminal N22.

Specifically, the second serial DAC 210 includes 2 reference voltages V1 and V2 supplied to the voltage supply terminals N1 and N2 respectively, and 2 capacitors C21 and C22, having a first terminal connected to the voltage supply terminal N1 and a second terminal connected to each of the terminals N21 and N22, a changeover switch 211 that switches and connects the terminal N21 to the voltage supply terminal N1 or N2, a switch 212 connected between the terminals N21 and N22, and a switch 213 connected between the terminal N22 and the voltage supply terminal N1. The terminal N22 is connected to a first input (gate of M21) of the second differential pair (M21 and M22) of the amplifier circuit 10. Meanwhile, capacitance values of the capacitors C21 and C22 are configured to be equal.

The first and the second serial DACs 110 and 210, respectively output voltage signals according to the digital signal ($B_1$-$B_K$) as voltages Vc12 and Vc22 to the amplifier circuit 10, by ON-OFF control of each switch by respectively inputted control signals 2 and 3.

As operations of the first and second serial DACs 110 and 210, FIG. 2 shows control of each switch of the first and second serial. DACs 110 and 210 in the first and second data period. Meanwhile, the first data period provides a reset period T11 and 2 periods for each 1-bit of the digital data signal ($B_1$-$B_K$) serially received, in k-bits, that is, in periods T12_$B_1$, T13_$B_1$, T12_$B_2$, T13_$B_2$, . . . , T12_$B_K$, and T13_$B_K$. Meanwhile, in FIG. 2, intermediate bit data $B_2$-$B_{(K-1)}$ portions are omitted. In the same way, the second data period provides a reset period T21 and 2 periods for each 1-bit of the digital data signal ($B_1$-$B_K$) serially received, in k-bits, that is, periods T22_$B_1$, T23_$B_1$, . . . , T22_$B_K$, and T23_$B_K$. Meanwhile, an arrow symbol → in FIG. 2 indicates continuation of a state (ON or OFF) of a previous period.

First, control of the switches 111, 112, and 113 of the first serial DAC 110 are explained. In the first data period, the switches 111, 112, and 113 are respectively set to OFF, OFF, and ON, in a reset period T11, and potential difference of the two ends (N1 and N12) of the capacitor C12 (voltage between terminals) is zero, that is, the terminal N12 is reset to a reference voltage V1.

Next, in the period T12_$B_1$, switches 111, 112, and 113 are set to ON, OFF, and OFF, respectively. At this time, at the terminal N11, either of the reference voltages V1 and V2 are selected (sampled) by the switch 111, in accordance with a value of bit data $B_1$ among the digital data ($B_1$-$B_K$) that have been received in a time serial manner. For example, when the bit data $B_1$=0, the reference voltage V1 is selected, and when the bit data $B_1$=1, reference voltage V2 is selected.

In the period T13_$B_1$, the switches 111, 112, and 113 are respectively set to OFF, ON, and OFF. At this time, charge accumulated in the capacitor C11 is redistributed among the capacitors C11 and C12 via the switch 112, and the redistributed charge is accumulated (held) in the capacitor C12.

Continuing, in the period T12_$B_2$, the switches 111, 112, and 113 are respectively set to ON, OFF and OFF. At this time, at the terminal N11, either of the reference voltages V1 and V2 is selected (sampled) by the switch 111, according to a value of the next bit data $B_2$. That is, similar to the bit data $B_1$, when the bit data $B_2$=0, the reference voltage V1 is selected, and when $B_2$=1, the reference voltage V2 is selected. In the period T13_$B_2$, the switches 111, 112, and 113 are respectively set to OFF, ON, and OFF, charge accumulated in the capacitor C11 is redistributed among the capacitors C11 and C12 via the switch 112 at this time, and the redistributed charge is accumulated (held) in the capacitor C12. Below, in the same way, sampling of the reference voltage up to sequential periods T12_$B_K$ and T13_$B_K$, and accumulation (holding) of redistributed charge in the capacitor C12 are repeated.

From this, at termination of the first data period in which K-bit data are inputted, a voltage signal $V_{N12}$ (=Vc12) of the terminal N12 has a value expressed by the formula (2) described below.

$$V_{N12}=(2^{-1} \cdot B_K + 2^{-2} \cdot B_{K-1} + \ldots + 2^{-K} \cdot B) \cdot (V2-V1) + V1 \qquad (2)$$

Note that $B_K, B_{K-1}, \ldots, B_1$ are 0 or 1, and the capacitors C11 and C12 have equal capacitance values. The voltage $V_{N12}$ is supplied to the amplifier circuit 10.

That is, the first serial DAC 110 can convert and output a voltage signal in accordance with K-bit data ($B_K, B_{K-1}, \ldots, B_1$), among voltage levels obtained by equally dividing between the reference voltages V1 and V2 in a first data period, into $2^K$ parts.

In the second data period, all of the switches 111, 112, and 113 are OFF, through 1 data period. Thus, the first serial DAC 110 holds the voltage signal $V_{N12}$, which was digital-analog converted in the first data period, in the capacitor C12, and also outputs the voltage signal $V_{N12}$ to the amplifier circuit 10 by the terminal N12.

Next, control of the switches 211, 212, and 213 of the second serial DAC 210 are explained. In the first data period, all of the switches 211, 212, and 213 are OFF, through 1 data period. Thus, the second serial DAC 210 holds the voltage signal, which was digital-analog converted in a data period one period before the first period, in the capacitor C22, and also outputs the voltage signal to the amplifier circuit 10.

On the other hand, in the second data period, control of the switches 211, 212, and 213 of each period T22_$B_1$, T23_$B_1$, ..., T22_$B_K$, and T23_$B_K$ and the reset period T21 is similar to control of the switches 111, 112, and 113 in the first data period.

Therefore, in cases in which the capacitors C21 and C22 have equal capacitance values, when the second data period, in which K-bit data are inputted, is terminated, a voltage signal $V_{N22}$ (=Vc22) of the terminal N22 also has a value expressed by formula (2).

Both of the voltage signals $V_{N12}$ and $V_{N22}$ are expressed by formula (2), but if a value of the K-bit data ($B_K, B_{K-1}, B_K, \ldots, B_1$) changes in the first or the second data period, clearly $V_{N12}$ and $V_{N22}$ will have different voltage values.

From the above, the digital-to-analog conversion circuit of FIG. 1, with regard to the second serial DAC 210, in the first data period, amplifies and outputs the voltage signal converted in a period one period before the first data period, from the output terminal N5 by the amplifier circuit 10. At this time, in the first serial DAC 110, conversion to a corresponding voltage signal Vc12 takes place in accordance with the first digital data signal that is bitwise serially received.

On the other hand, in the second data period, in the first serial DAC 110, the voltage signal Vc12 converted in the first data period is amplified and outputted from the output terminal N5 by the amplifier circuit 10. At this time, in the second serial DAC 210, conversion to a corresponding voltage signal Vc22 takes place in accordance with the second digital data signal that is serially received by a bit terminal.

By separating a period in which the received digital data is converted into a voltage signal and a period in which the converted voltage signal is amplified and outputted to a data line, into different data periods, the digital-to-analog conversion circuit of FIG. 1 can fully ensure, within 1 data period, a drive period of the voltage signal to the data line. Thus, application is possible to a data driver of a large-screen, high-definition display device in which data line load capacitance is large and 1 data output period is short. Since the DAC has a configuration that does not depend on number of bits, it is possible to realize reduced area, for multiple bits.

In the digital-to-analog conversion circuit of FIG. 1, the differential stage of the amplifier circuit and serial DAC is doubled, in comparison to the configuration of FIG. 10, but by sharing the amplifier stage, rather than simply doubling the digital-to-analog conversion circuit of FIG. 10, reduced area and reduced power dissipation are realized.

Regarding power dissipation, the amplifier stage occupies at least approximately 70% to 80% of static consumption current in a general amplifier circuit, and static consumption current in the differential stage is relatively small. Therefore, in the digital-to-analog conversion circuit according to the present invention, even if the differential stage is doubled, it is possible to suppress increase of power dissipation to a comparatively small value.

Regarding area, phase compensation capacitor (not shown in the drawings), generally arranged in an amplifier stage of an amplifier circuit that has a feedback configuration, occupies a relatively large area, but in the digital-to-analog conversion circuit according to the present invention, the phase compensation capacitor may be provided in one amplifier stage for one data line.

In the first and second serial DACs 110 and 210, due to demands of reducing area and the like, capacitance values of capacitors (C11, C12, C21, and C22) are preferably set to small values (for example, of the order of 100 fF (femtofarad; 1 femto is 10-15). However, if the capacitance values of these capacitors are made small, a parasitic capacitance effect of a transistor connected to the capacitor cannot be ignored. Solving this problem is also one of features of the present invention. An explanation is given below.

For example, in FIG. 1, consider as a comparative example a configuration, in which an amplifier circuit 10 (buffer circuit) is composed by one differential stage (for example, a first differential pair (M11 and M12), a current source M10, and a load circuit (M13 and M14)) and an amplifier stage 15; a changeover switch (not shown in the drawing) is inserted between output ends N12 and N22 of the first and second serial DACs 110 and 210 and a non-inverting input end of one differential stage of the amplifier circuit 10; and by switching input to the non-inverting input end of the one differential stage of the amplifier circuit 10 to output voltage from the output end N11 or N22, both the one differential stage and the one amplifier stage are shared with respect to the first and second serial DACs 110 and 210. In case each capacitance of the serial DACs is small, when connection of each output end N11 and N22 of the serial DACs 110 and 210, and the non-inverting input end of the differential stage (gate of transistor M11) are switched, capacitive coupling occurs between gate capacitance (referred to as "gate side parasitic capacitance") (of the order, for example, of 1 fF) of the transistor M11 of the non-inverting input end side, which is in a different potential state, and the capacitor C12 or C22, and by charge redistribution, voltage of the capacitors C12 or C22, accumulated by a cycle operation (DA conversion operation by repeated sampling and holding) of the serial DACs, changes, and as a result, a problem occurs in that an output error of the digital-to-analog conversion circuit is caused. For example, in case potential difference between the reference voltages V1 and V2 is a liquid crystal application voltage of 5 to 8 V, the output error is of the order of about 1 mV. In the serial DACs, since in general with regard to bit number of the digital data, 2 or 3 bits are added to display data bit number, even if with 8-bit display data, 10 or more bits are required, voltage different between tones is of the order of 1 mV, and the abovementioned output error (of the order of about 1 mV) is of a size that cannot be ignored.

As a difference from the abovementioned comparative example concerning this type of problem, in the present example, as shown in FIG. 1, the first and second differential stages corresponding respectively to the first and second serial DACs 110 and 210 are provided. Regarding a serial DAC that performs a DA conversion operation (cycle operation) of the first and second serial DACs 110 and 210, in a state in which the gate of a differential pair transistor of the differential stages corresponding to the output ends of the serial DACs are connected, the redistribution of charge is performed inclusive of gate capacitance of a differential pair transistor. Thus, it is possible to output, with high accuracy, voltage of the capacitor C12 or C22 accumulated in the cycle operation of the serial DAC 110 or 210, from the output end N5 of the digital-to-analog conversion circuit.

That is, according to the present example, as in the abovementioned comparative example, capacitive coupling occurs between transistor gate capacitance of a non-inverting input end of the differential stage and the capacitor C12 or C22 of the serial DACs, and occurrence of the problem that the terminal voltage of the capacitor C12 or C22, in which charge has been accumulated in the cycle operation, changes due to the charge redistribution, is suppressed, to contribute to higher accuracy.

In the present example, capacitance for sampling and holding in the serial DACs is preferably set to a capacitance value by taking in consideration a gate capacitance of the differential pair transistors. For example, in the case of the first serial DAC 110, a capacitance value, in which the gate capacitance values of the differential pair transistors M11 and M12 is added to the actual capacitance value of C12, is a hold capacitance value. That is, apparent capacitance of the capacitor C12 includes the gate capacitance of the differential pair transistors M11 and M12. In a such case, a configuration may be provided on the capacitor C11 side, by arranging, for example, a dummy MOS transistor of a gate capacitance equivalent to the sum of capacitance values of each gate capacitance of the differential pair transistors M11 and M12. This configuration facilitates design of capacitors C11 and C12 having equal capacitance values. The same may be said concerning the second serial DAC 210. Meanwhile, in actuality, not only transistor gate capacitance but also a parasitic capacitance between wirings is included. The parasitic capacitance between wirings is less than the gate capacitance by a factor of 10 or more, and can be made negligible by adopting a symmetric wiring configuration with respect to two capacitors performing the charge redistribution.

However, when a cycle operation (DA conversion operation) is being performed, in cases of redistributing charge including gate capacitance of the differential pair transistors, it is necessary to hold constant the gate capacitance of the differential pair transistors. The gate capacitance of the transistors has a characteristic of changing in response to a state of the transistor. In particular, since the gate capacitance changes in an ON state and in an OFF state, in a cycle operation, the differential pair transistors connected to output ends of the serial DACs must be stably held in an ON state.

The present example has a configuration in which in the cycle operation, the gates of the differential pair transistors connected to the output end of the serial DAC is connected in common and the output voltage of the serial DAC is received in common mode. Thus, even if the voltage supplied in common to the gates of the differential pair transistors, in the cycle operation process, varies, coupled source potential of the differential pair transistors also similarly varies, as a result of which, the differential pair transistor is stably held in an ON state.

According to the present example having the above described configuration, the capacitance value of capacitors for sampling and holding in the serial DACs is small, and it is possible to improve accuracy of output voltage of the voltage follower (buffer circuit), while realizing reduction in area.

Meanwhile, the reference voltages (V1 and V2) supplied to the serial DACs are respectively set to a minimum value and a maximum value of grayscale voltage in response to polarity, the voltage is set in advance so that the differential pair transistors operating in response to output of the serial DACs is in an ON state.

From the above, in the digital-to-analog conversion circuit of the present invention, even if the capacitances of the serial DACs are set to small values, effects of parasitic capacitance are suppressed to realize high accuracy voltage output.

Example 2

Figure 3:
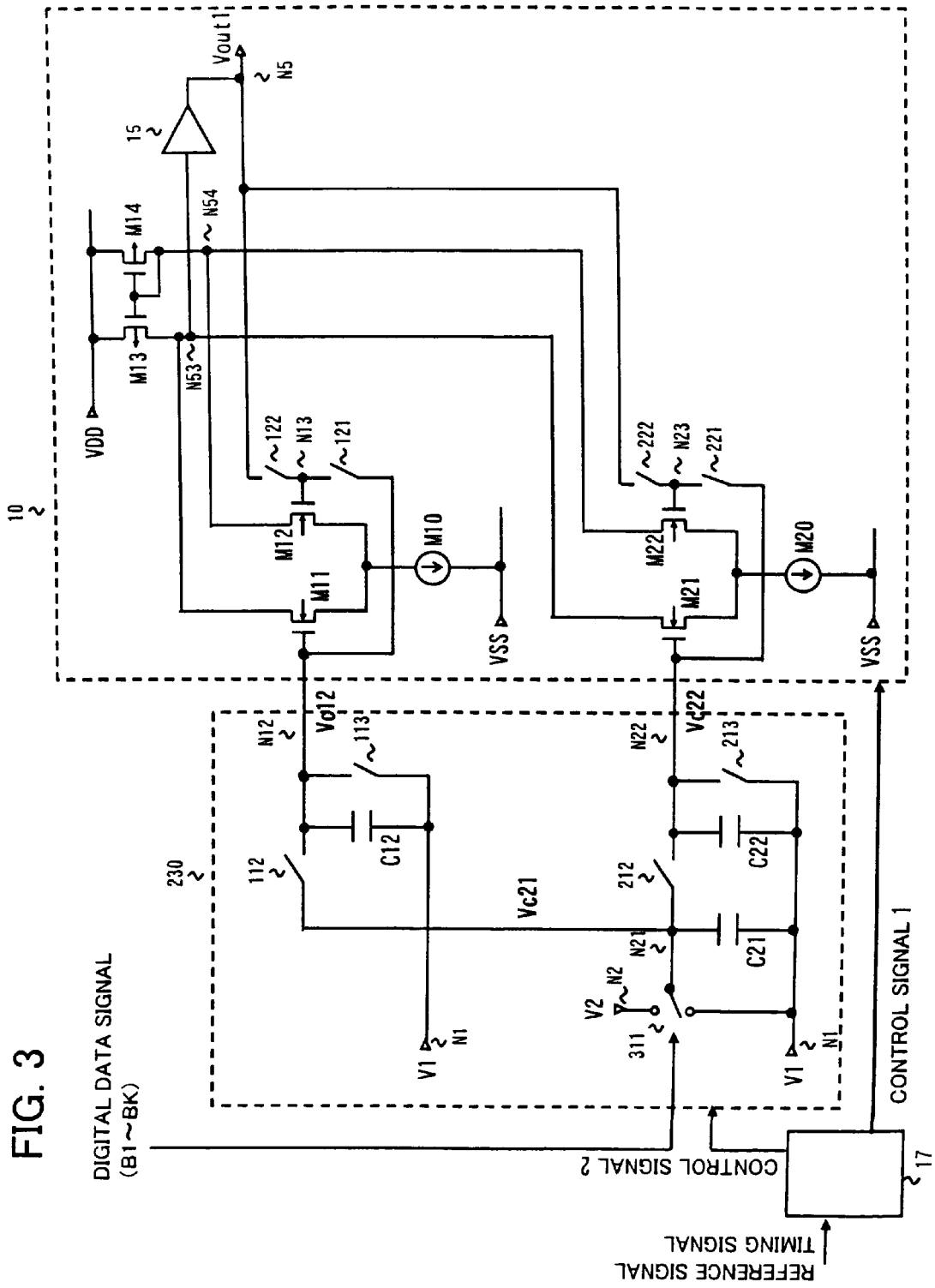

Next, a second example of the present invention will be explained. FIG. 3 shows a configuration of a digital-to-analog conversion circuit of the present example. Referring to FIG. 3, the digital-to-analog conversion circuit of the present example includes an amplifier circuit 10, a serial DAC 230, and a control signal generation circuit 17.

The control signal generation circuit 17 receives a reference signal CLK and a timing signal, generates control signals 1 and 2 based on at least the reference signal CLK and the timing signal and supplies control signals 1 and 2 to the amplifier circuit 10 and the serial DAC 230.

The digital-to-analog conversion circuit shown in FIG. 3 has a configuration in which elements that can be shared between the serial DACs 110 and 210 of FIG. 1 are put together, to reduce the number of DAC elements (area). The serial DAC 230 will be described in the below. Meanwhile, the amplifier circuit 10 has a similar configuration and similar operation to FIG. 1, and an explanation of the amplifier circuit 10 is omitted.

The serial DAC 230 receives as input a K-bit digital data signal ($B_1$-$B_K$); a control signal 2; and outputs analog voltage signals Vc12 and Vc22 at terminals N11 and N12, respectively.

Specifically, the serial DAC 230 includes voltage supply terminals N1 and N2 for receiving two reference voltages V1 and V2, respectively, a capacitor C21 having a first terminal connected to the voltage supply terminal N1 and a second terminal connected to the terminal N21, capacitors C12 and C22 having first terminals connected to the voltage supply terminals N1 and second terminals connected to terminals N12 and N22, respectively, a changeover switch 311 that switches and connects the terminal N21 to the voltage supply terminal N1 or N2, switches 112 and 212 that connect the terminal N21 to the terminals N12 and N22, respectively, and switches 113 and 213 that respectively connect the terminals N12 and N22 to the voltage supply terminals N1.

The terminal N12 and N22 are connected to a first input (gate of M11) of a first differential pair (M11 and M12) of the amplifier circuit 10, and a first input (gate of M21) of a second differential pair (M21 and M22), respectively. Meanwhile, capacitance values of the capacitors C12, C21, and C22 are configured to be equal.

That is, the serial DAC 230 of FIG. 3 is configured such that the switch 111 and the capacitor C11 of the serial DAC 110 of FIG. 1 is made common with the switch 211 and the capacitor 21 of the serial DAC 210, and the switch 211 is replaced by the switch 311.

The serial DAC 230 outputs voltage signals in accordance with the digital data signal ($B_1$-$B_K$) as Vc12 and Vc22 to the amplifier circuit 10, by ON-OFF control of each switch by the inputted control signal 2.

Operation of the serial DAC 230 will be described with reference to FIG. 4. In FIG. 4, there is shown control of each switch (112, 113, 212, 213, and 311) of the serial DAC 230 in first and second data periods. The first data period includes a reset period T11 and 2 periods for each 1-bit of the digital data signal ($B_1$-$B_K$) that has been serially received, in K-bits.

That is, the periods are T12_$B_1$, T13_$B_1$, T12_$B_2$, T13_$B_2$, T12_$B_K$, and T13_$B_K$. Meanwhile, in FIG. 4, intermediate bit data $B_2$-$B_{(K-1)}$ portions are omitted.

In the same way, the second data period includes a reset period T21 and 2 periods for each 1-bit of the digital data signal ($B_1$-$B_K$) that has been serially received, in K-bits, that is, periods T22_$B_1$, T23_$B_1$, ..., T22_$B_K$, and T23_$B_K$. An arrow symbol → in FIG. 4 indicates continuity of a state (ON or OFF) of a previous period.

Control of the switches 112, 113, 212, 213, and 311 of the serial DAC 230 will now be described. In the first data period, the switches 212 and 213 are OFF through 1 data period. With regard to the first data period, in the reset period T11, the switch 113 is ON and the switch 112 is OFF, and a potential difference (inter-terminal voltage) between the two ends (N1 and N12) of the capacitor C12 is reset to zero.

Next, in period T12_$B_1$, switches 311, 112, and 113 are respectively set to ON, OFF, and OFF. At this time, at the terminal N21, either of the reference voltages V1 and V2 are selected (sampled) by the switch 311, in accordance with a value of bit data B1 among the digital data ($B_1$-$B_K$) that have been received in a time serial manner. In period T13_$B_1$, the switches 311, 112, and 113 are respectively OFF, ON, and OFF.

At this time, charge accumulated in the capacitor C21 is redistributed between the capacitors C21 and C12 via the switch 112, and the redistributed charge is accumulated and held in the capacitor C12.

Below, in the same way, sampling of the reference voltage up to sequential periods T12_$B_K$ and T13_$B_K$, and accumulation (holding) of redistributed charge in the capacitor C12 are repeated.

From this, at a time when the first data period, during which K-bit data are inputted, is terminated, a voltage signal $V_{N12}$ (=Vc12) of the terminal N12 has a value expressed by the above mentioned formula (2).

That is, the serial DAC 230 can convert and output, to the terminal N12, a voltage signal in accordance with K-bit data ($B_K$, $B_{K-1}$, ..., $B_1$), among voltage levels obtained by equally dividing between the reference voltages V1 and V2 into $2^K$ parts.

On the other hand, with regard to the voltage signal of the terminal N22, since the switches 212 and 213 are both OFF through 1 data period, the voltage signal converted in a data period that is 1 period before, is held as it is.

In the second data period, the switches 112 and 113 are both OFF through 1 data period. With regard to the second data period, in the reset period T21, the switch 213 is ON and the switch 212 is OFF, and a potential difference (inter-terminal voltage) between the two ends (N1 and N22) of the capacitor C22 is reset to zero.

In the period T22_$B_1$, switches 311, 212, and 213 are respectively set to ON, OFF, and OFF.

At this time, at the terminal N21, either of the reference voltages V1 and V2 is selected (sampled) by the switch 311, in accordance with a value of bit data $B_1$ in the digital data ($B_1$-$B_K$) received in a time serial manner.

In the period T23_$B_1$, the switches 311, 212, and 213 are respectively set to OFF, ON, and OFF. At this time, charge accumulated in the capacitor C21 is redistributed between the capacitors C21 and C22 via the switch 212, and the redistributed charge is accumulated (held) in the capacitor C22.

Below, in the same way, sampling of the reference voltage up to sequential periods T22_$B_K$ and T23_$B_K$, and accumulation (holding) of redistributed charge in the capacitor C12 are repeated.

From this, at a time when the first data period, in which K-bit data are inputted, is terminated, a voltage signal $V_{N22}$ (=Vc22) of the terminal N22 has a value expressed by the above described formula (2).

That is, the serial DAC 230 can convert and output a voltage signal to a terminal N22 in accordance with K-bit data ($B_K$, $B_{K-1}$, ..., $B_1$), among voltage levels obtained by equally dividing between the reference voltages V1 and V2 into $2^K$ parts.

On the other hand, with regard to the voltage signal of the terminal N12, since the switches 112 and 113 are both OFF through 1 data period, the voltage signal Vc12 that was converted in the first data period is held as it is.

The amplifier circuit 10, similar to FIG. 1, in the first data period, amplifies and outputs the voltage signal of the terminal N22 at an output terminal N5, and in the second data period, amplifies and outputs the voltage signal of the terminal N12 by the output terminal N 5.

Thus, the digital-to-analog conversion circuit of FIG. 3, in the first data period, in the serial DAC 230, amplifies and outputs a voltage signal converted in a period one period before the first data period, held in the terminal N22, from the output terminal N5 by the amplifier circuit 10. At this time, conversion is performed to a corresponding voltage signal Vc12, in response to the first digital data signal serially received in a bitwise manner.

On the other hand, in the second data period, in the serial DAC 230, the voltage signal Vc12 that has been converted in the first data period, and held in the terminal N12, is amplified and outputted from the output terminal N5 by the amplifier circuit 10.

At this time, conversion is performed to a corresponding voltage signal Vc22, in response to the second digital data signal serially received by a bit terminal.

The digital-to-analog conversion circuit of FIG. 3 also, similarly to FIG. 1, can also fully ensure a drive period of a voltage signal to a data line within 1 data period, and can be applied to a data driver for a large-screen, high-definition display device in which data line load capacitance is large and 1 data output period is short. Meanwhile, although area is increased in comparison to FIG. 10, it is possible to share a portion of 2 serial DACs and an amplifier stage, to provide reduced area and lower power dissipation, than simply doubling the digital-to-analog conversion circuit of FIG. 10. Similarly to FIG. 1, configuration is such that an input pair of a differential stage connected to an output end of the serial DAC is connected in common, when a cycle operation is performed, and output of the serial DAC is received in common mode. In the digital-to-analog conversion circuit of FIG. 3, even if the capacitance of the serial DAC is set to a small value, parasitic capacitance effects are suppressed to realize accuracy voltage output.

Example 3

Figure 5:
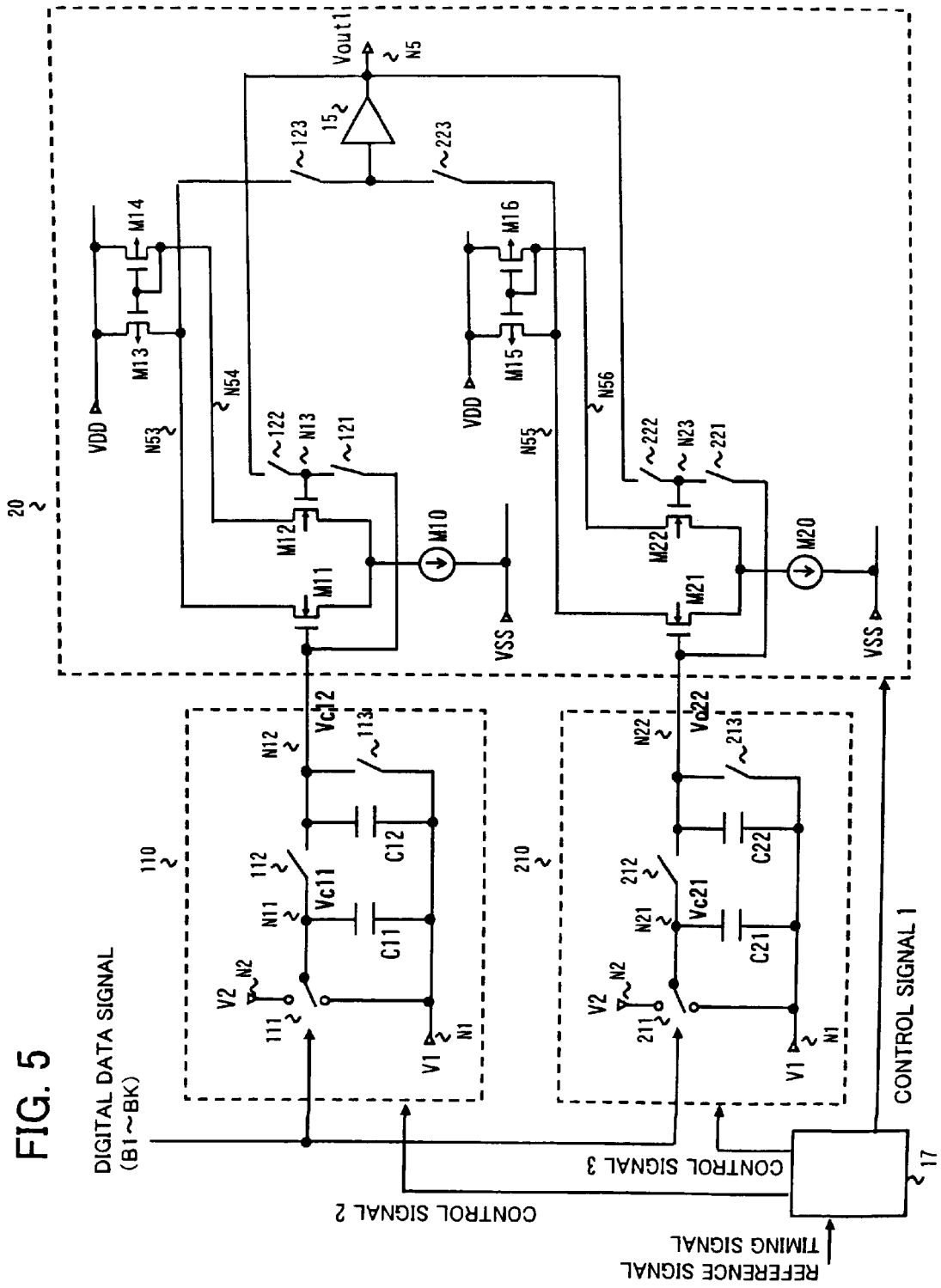

FIG. 5 shows a configuration of a third example of the present invention. Referring to FIG. 5, the digital-to-analog conversion circuit of the present example includes an amplifier circuit 20, serial DACs 110 and 210, and a control signal generation circuit 17.

The control signal generation circuit 17 receives a reference signal CLK and a timing signal, and generates control signals 1 to 3, based at least the two signals received, to supply the control signals 1 to 3 to the amplifier circuit 20 and the serial DACs 110 and 210.

A characteristic of the digital-to-analog conversion circuit of FIG. 5 is that it is configured such that the load circuit shared in the amplifier circuit 10 of FIG. 1 is separated, and output of first and second differential pairs (M11 and M12) and (M21 and M22) is switched and supplied to an amplifier stage 15.

The amplifier stage 15 is shared by first and second differential pairs and load circuits respectively corresponding thereto.

The amplifier circuit 20 will now be described. The serial DACs 110 and 210 have a similar configuration and similar operation to FIG. 1, and an explanation is omitted.

The amplifier circuit 20 includes a first NMOS differential pair (M11 and M12) and a second NMOS differential pair (M21 and M22).

The amplifier circuit 20 further includes a current source M10 connected between coupled sources of the first differential pair (M11 and M12) and a low potential power supply VSS, and a current source M20 connected between coupled sources of the second differential pair (M21 and M22) and the low potential power supply VSS.

The amplifier circuit 20 further includes a PMOS current mirror (M13 and M14) as a load circuit connected between a high potential power supply VDD and an output pair (terminals N53 and N54) of the first differential pair (M11 and M12).

The amplifier circuit 20 further includes a PMOS current mirror (M15 and M16) as a load circuit connected between the high potential power supply VDD and an output pair (terminals N55 and N56) of the second differential pair (M21 and M22).

The amplifier circuit 20 further includes a switch 123 connected between an input end of the amplifier stage 15, and one end (terminal N53) of a connection node pair of the load circuit (M13 and M14) and an output pair (terminals N53 and N54) of the first differential pair (M11 and M12), and a switch 223 connected between the input end of the amplifier stage 15, and one end (terminal N55) of a connection node pair of the load circuits (M15 and M16) and an output pair (terminals N55 and N56) of the second differential pair (M21 and M22).

Output of the amplifier stage 15 is connected to the output terminal N5. The amplifier circuit 20 further includes a switch 121 connected between a first input (gate of M11) and a second input (gate of M12) of an input pair of the first differential pair (M11 and M12), and a switch 122 connected between the output terminal N5 and a second input of the first differential pair (M11 and M12).

The amplifier circuit 20 further includes a switch 221 connected between a second input (gate of M22) and a first input (gate of M21) of the second differential pair (M21 and M22), and a switch 222 connected between the output terminal N5 and a second input of the second differential pair (M21 and M22). First and second voltage signals Vc12 and Vc22 are supplied to a first input of each of said first and second differential pairs (M11 and M12) and (M21 and M22).

The amplifier circuit 20 outputs, as Vout1, an output signal according to one of first and second voltage signals supplied to each of said first and second differential pairs (M11 and M12) and (M21 and M22), by ON-OFF control of the switches 121, 122, 123, 221, 222, and 223 by a control signal 1.

In the amplifier circuit 20, an output stage is shared by the first and second differential pairs (M11 and M12) and (M21 and M22) and respective load circuits corresponding the first and second differential pairs. In comparison with a configuration in which a load circuit and an output stage are provided for each of said first and second differential pairs (M11 and M12) and (M21 and M22), element reduction (reduction in area) and low power dissipation are possible.

Operation of the amplifier circuit 20 of the present example will now be described with reference to FIG. 6. Each switch of FIG. 5, excepting switches 123 and 223, have control similar to FIG. 2, and explanations concerning control of each are omitted. Below, only control of switches 123 and 223, and switches related thereto are explained.

Control similar to that of switches 122 and 222 is performed respectively in switches 123 and 223. That is, in a first data period, the switches 123 and 223 are set to OFF and ON respectively, and in a second data period the switches 123 and 223 are set to ON and OFF respectively. Therefore, in the first data period, the voltage signal Vc22 of the terminal N22 is amplified and outputted from the output terminal N5 by the amplifier circuit 20, and in the second data period, the voltage signal Vc12 of the terminal N12 is amplified and outputted from the output terminal N5 by the amplifier circuit 20.

The digital-to-analog conversion circuit of the present example shown in FIG. 5, similarly to the first example shown in FIG. 1, can also fully ensure a drive period of a voltage signal to a data line within 1 data period, and can be applied to a data driver of a large-screen, high-definition display device in which data line load capacitance is large and 1 data output period is short.

Although area is increased in the digital-to-analog conversion circuit of the example shown in FIG. 5, in comparison to the configuration of FIG. 10, by sharing the amplifier stage, reduced area and lower power dissipation are realized in comparison to simply doubling the digital-to-analog conversion circuit of FIG. 10. Similarly to FIG. 1, a configuration is such that an input pair of the differential stages connected to an output end of the serial DAC is connected in common, when a cycle operation is performed, and output of the serial DAC is received in common mode; and in the digital-to-analog conversion circuit of FIG. 5, even if capacitance of the serial DAC is set to a small value, parasitic capacitance effects are curtailed to enable high accuracy voltage output.

The serial DACs 110 and 210 of FIG. 5 can be substituted for the serial DAC 230 of FIG. 3.

Example 4

Figure 7:
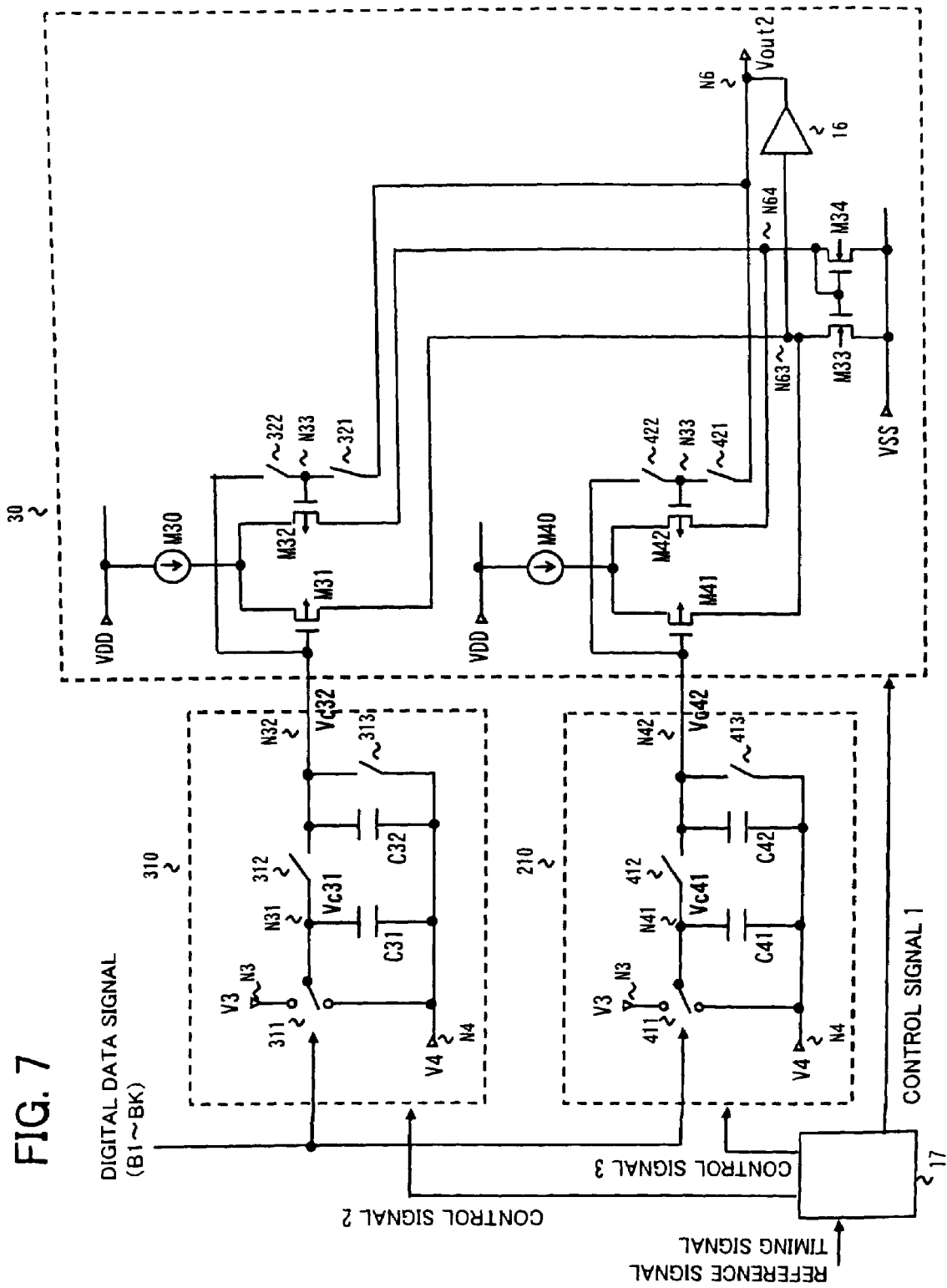
FIG. 7 shows a configuration of a fourth example of the present invention.

Next, a fourth example of the present invention will be explained. FIG. 7 has a configuration in which polarity of the load circuit and the differential pairs of the amplifier circuit 10 of the digital-to-analog conversion circuit of the first example shown in FIG. 1 are reversed. Effects and results are similar to FIG. 1.

Example 5

Figure 8:
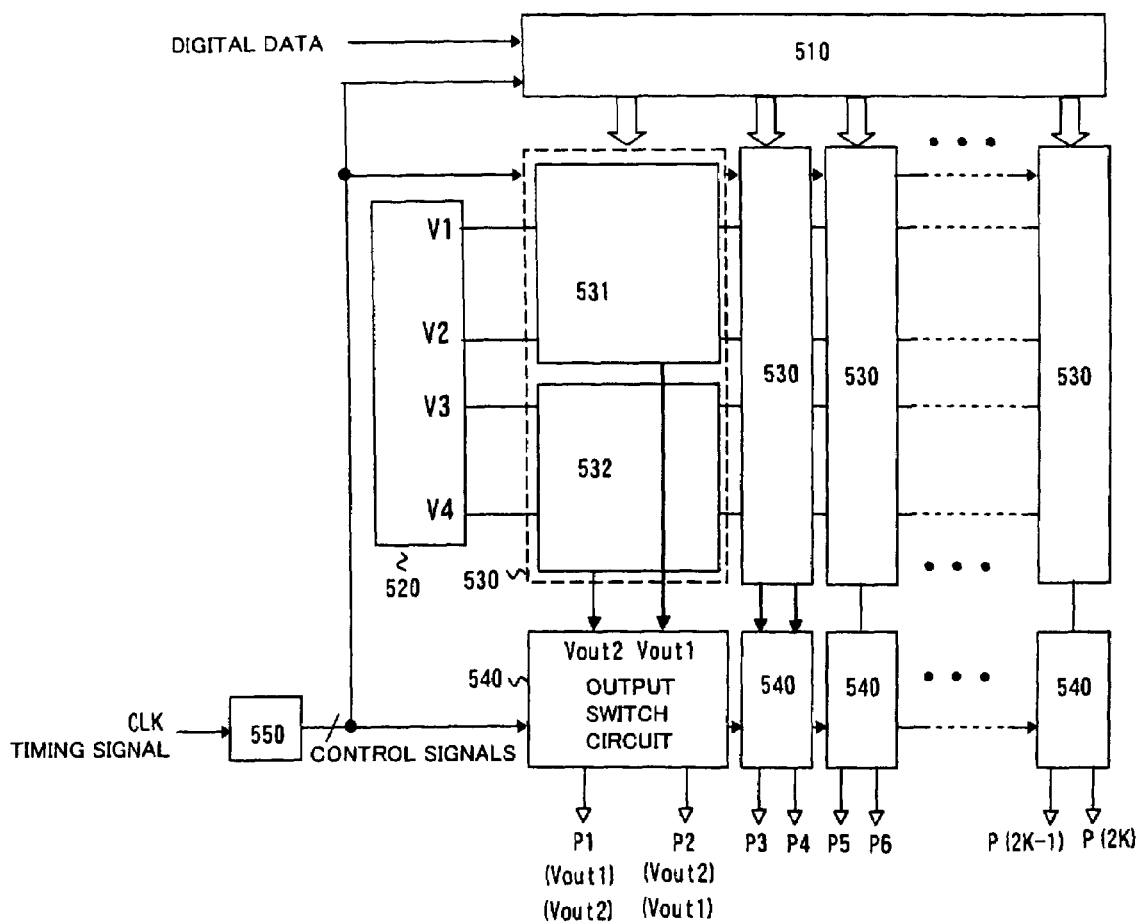
FIG. 8 shows a configuration of a fifth example of the present invention.

A fifth example of the present invention will be described. FIG. 8 is a data driver configured using the digital-to-analog conversion circuit of any of FIG. 1, FIG. 3, FIG. 5, and FIG.

7. Referring to FIG. 8, the data driver of the present example includes a serial-to-parallel conversion and latch circuit 510, a reference voltage generation circuit 520, digital-to-analog conversion circuits 530, an output switch circuit 540, and a control signal generation circuit 550.

The serial-to-parallel conversion and latch circuit 510 receives a high speed digital data signal such as LVDS (Low Voltage Differential Signaling) or the like, and a control signal from the control signal generation circuit 550, and performs serial to parallel converting of a serialized data signal corresponding to number of outputs, latches the parallel data bit by bit, and outputs a data signal in a bitwise manner, in accordance with a prescribed timing, to each digital-analog conversion circuit 530.

The digital-to-analog conversion circuits 530 are arranged for each two output units, and are provided with digital-to-analog conversion circuits 531 and 532 corresponding to a positive polarity and a negative polarity, respectively.

Operation of the digital-to-analog conversion circuits 530 is also controlled by control signals from the control signal generation circuit 550.

Reference voltages V1 and V2 generated by the reference voltage generation circuit 520 are supplied to the positive polarity side digital-to-analog conversion circuit 531, and a voltage signal Vout1 on the positive polarity side is converted and outputted in response to a data signal sequentially outputted in a bitwise manner from the circuit 510.

Reference voltages V3 and V4 generated by the reference voltage generation circuit 520 are supplied to the negative polarity side digital-to-analog conversion circuit 532, and a voltage signal Vout2 on the negative polarity side is converted and outputted in response to a data signal sequentially outputted in a bitwise manner from the circuit 510.

The output switch circuit 540 switches and outputs the voltage signals Vout1 and Vout2 output from the digital-to-analog conversion circuits 530, to driver output terminals P1 and p2 at a prescribed timing. Switch timing is controlled by a control signal from the control signal generation circuit 550, and switching is performed at a prescribed data period unit or the like. Moreover, for the driver output terminals P1, P2, ... and P(2K), control is performed so that the odd numbered terminals and even numbered terminals have mutually different voltage polarity.

The control signal generation circuit 550 generates control signals necessary for circuit blocks 510, 530 (531 and 532), and 540, based on CLK and timing signals.

For the digital-to-analog conversion circuit 531 on the positive polarity side, the digital-to-analog conversion circuits of the various examples described with reference to FIG. 1, FIG. 3, and FIG. 5, can be applied.

The digital-to-analog conversion circuit 532 on the negative polarity side is implemented by reversing the polarity of transistors composing the amplifiers of the digital-to-analog conversion circuit of the example described with reference to FIG. 7, and the digital-to-analog conversion circuit described with reference to FIG. 3 and FIG. 5.

Example 6

A sixth example of the present invention will now be described. In a data driver of the example shown in FIG. 8, by providing digital-to-analog conversion circuits of each of the examples described with reference to FIG. 1, FIG. 3, FIG. 5, and FIG. 7, it is possible to realize a data driver with low area while having multi-bits, by a configuration in which a DAC does not depend on the number of bits. Preferably, the example is applied to a large screen, high definition display device in which data line load capacitance is large and 1 data output period is short.

Figure 9:
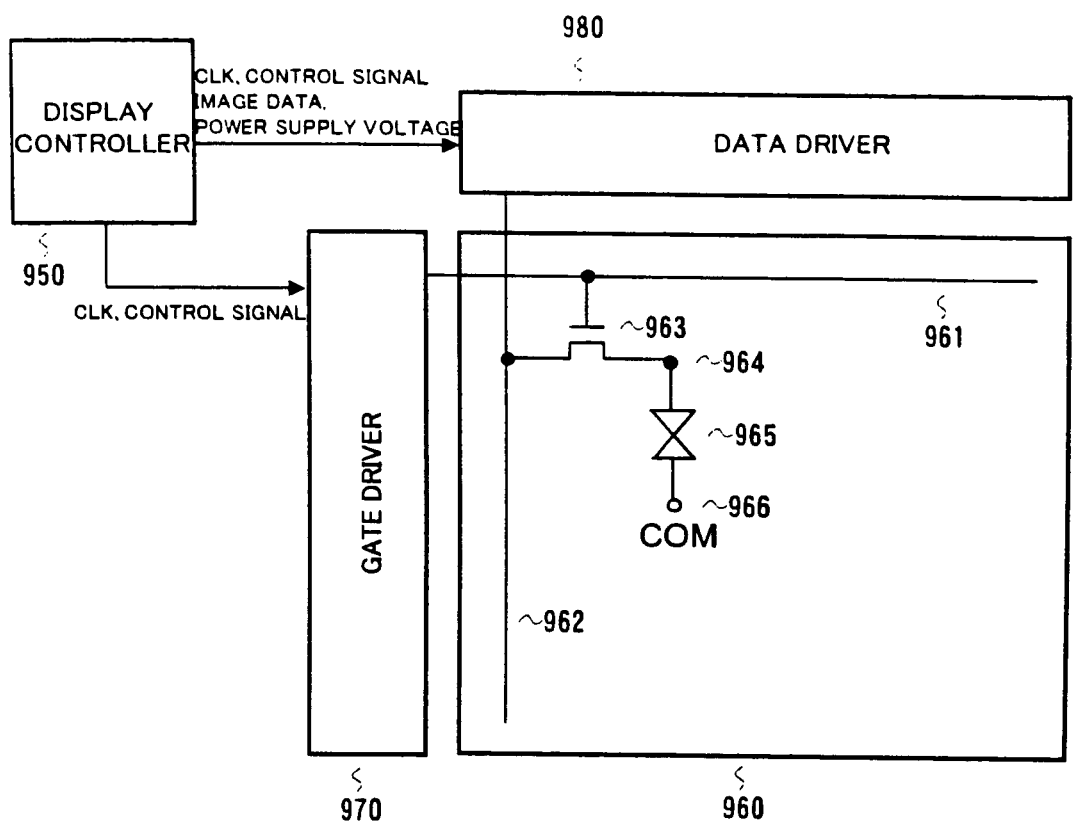
FIG. 9 shows a configuration of a display device.

The data driver of the present example shown in FIG. 8 may be applied to a data driver 980 of a liquid crystal display device shown in FIG. 9.

However, in the data driver shown in FIG. 8, since the voltage output with respect to tone is linear, in order to output voltage matching a gamma characteristic of the liquid crystal, it is necessary to increase the bit number of the data displayed by the display controller 950, by several bits. For example, when the displayed data are 10 bits, an increase of +2 bits, to 12 bit data, is performed, to make a correspondence between a voltage signal having a 12-bit linear characteristic and a voltage signal including a 10-bit gamma characteristic. To put it simply, a conversion table may be provided for converting from 10-bit data to 12-bit data in the display controller 950. By this method, it is possible to use the data driver of FIG. 8 in the liquid crystal display device of FIG. 9.

In the present invention the driver of the liquid crystal display device is not limited to only a liquid crystal display device, and can clearly be applied also to other display devices and driver circuits. In the example shown in FIG. 1 and the like, an explanation has been given of an example in which the present invention is applied to a digital-to-analog conversion circuit provided with the first and second serial DACs and the amplifier circuit, but clearly the present invention may be applied to a configuration provided with the first and second sample and hold circuits, and the amplifier circuit (buffer) which receives output of the first and second sample and hold circuits. That is, the first and second sample and hold circuits are arranged, alternately performing switching in which, when one circuit performs a sampling operation of an input signal, the other circuit performs an operation of holding the sampled signal; and when one of the differential circuits of the first and second differential circuits has a voltage follower configuration, a signal held by one of the sample and hold circuits is supplied to the non-inverting input end of the one differential circuit, and a sampling operation is performed in the other sample and hold circuit corresponding to the other differential circuit in which a common-mode signal is supplied to the inverting input end and the non-inverting input end. As the common mode signal inputted commonly to the inverting input end and the non-inverting input end of the other differential circuit, an output signal of the other sample and hold circuit, in which the sampling operation is performed, is inputted. In the configuration sampling voltage signals are accumulated in the capacitance of the sample and hold circuit, including differential pair gate capacitance of the differential circuit connected to the sample and hold circuit when the sampling operation is performed, and by having a configuration in which the sampling voltage signal is received in common mode at the differential pair gates, high accuracy voltage output in which effects of parasitic capacitance are curtailed is possible, even if the capacitance of the sample and hold circuit is set to a small value.

Each disclosure of the abovementioned patent document and non-patent document are incorporated by reference into this document. Modifications and adjustments of examples and examples are possible within a framework of the entire disclosure (including the scope of the claims) of the present invention, and in addition, based on a fundamental technological concept thereof. Moreover, a large variety of combinations and selections are possible, of every sort of disclosed element within the scope of the claims of the present invention. That is, the present invention clearly includes all types of modification and alterations that could be realized by a person skilled in the art, according to technological concepts and the entire disclosure including the scope of the claims.

What is claimed is:

1. An amplifier circuit comprising:
   first and second differential stages; and
   an amplifier stage that, responsive to output signals of the first and second differential stages, performs a charging or a discharging drive operation of an output terminal of said amplifier circuit, wherein:
   a first mode and a second mode are switched;
   in said first mode, when the first signal and a feedback signal from the output terminal are respectively supplied to the first and second inputs of the input pair of said first differential stage, the second signal being supplied in common to the first and second inputs of the second differential stage; and
   in said second mode, when the second signal and a feedback signal from the output terminal are respectively supplied to the first and second inputs of the input pair of said second differential stage, the first signal being supplied in common to the first and second inputs of said first differential stage.

2. The amplifier circuit according to claim 1, wherein
   said first differential stage includes a first differential pair;
   said second differential stage includes a second differential pair; and
   said amplifier circuit comprises a load circuit to which output pairs of said first and second differential pairs are connected in common, at least one output of the commonly connected output pairs of said first and second differential pairs is connected to an input of said amplifier stage.

3. The amplifier circuit according to claim 1, wherein
   said first differential stage comprises:
   a first differential pair; and
   a first load circuit connected to an output pair of the first differential pair;
   said second differential stage comprises:
   a second differential pair; and
   a second load circuit connected to an output pair of the second differential pair; and
   at least one output of the output pair of the first differential pair or at least one output of the output pair of the second differential pair is switched and supplied to an input of the amplifier stage.

4. The amplifier circuit according to claim 1, further comprising:
   a first switch inserted between the output terminal and the second input of the input pair of said first differential stage;
   a second switch inserted between the first input and the second input of the input pair of said first differential stage;
   a third switch inserted between the output terminal and the second input of the input pair of said second differential stage; and
   a fourth switch inserted between the first input and the second input of the input pair of said second differential stage.

5. The amplifier circuit according to claim 3, further comprising:
   a first switch inserted between the input of the amplifier stage and at least one output of an output pair of the first differential pair; and
   a second switch inserted between the input of the amplifier stage and at least one output of an output pair of the second differential pair.

6. A digital-to-analog conversion circuit comprising:
   the amplifier circuit as set forth in claim 1; and
   first and second digital-to-analog converters which respectively output, as the first and second signals, signals obtained by sampling and holding voltage signals corresponding respectively to first and second digital signals received.

7. A digital-to-analog conversion circuit comprising:
   the amplifier circuit as set forth in claim 1; and
   first and second serial DACs (digital-to-analog converters) which respectively convert and output the first and second signals, in response to first and second digital signal received time serially.

8. The digital-to-analog conversion circuit according to claim 7, wherein in a first data period,
   said first serial DAC converts the first digital signal received in the first data period into the first signal;
   said second serial DAC holds a signal obtained by converting a digital signal received in a data period one period before the first data period;
   the amplifier circuit amplifies and outputs the signal held in said second serial DAC at said output terminal; and
   in a second data period following after the first data period,
   said second serial DAC converts the second digital signal received in the second data period into the second signal;
   said first serial DAC holds the first signal converted in the first data period; and
   said amplifier circuit amplifies and outputs the first signal at said output terminal.

9. The digital-to-analog conversion circuit according to claim 8, wherein at least one of the first and second serial DACs comprises:
   a changeover switch that changes over the connections of an output end to one of a first potential terminal and a second potential terminal, in accordance with a value of each bit of a received digital signal;
   a first capacitor connected between the output end of the changeover switch and the first potential terminal;
   a first switch that has one end connected to the output end of the changeover switch;
   a second capacitor that is connected between another end of the first switch and the first potential terminal; and
   a second switch connected between terminals of the second capacitor.

10. The digital-to-analog conversion circuit according to claim 8, wherein
    said first serial DAC comprises:
    a changeover switch that changes over the connection of an output end to one of a first potential terminal and a second potential terminal, in accordance with a value of each bit of a received digital signal;
    a first capacitor that is connected between the output end of the changeover switch and the first potential terminal;
    a first switch that has one end connected to the output end of the changeover switch;
    a second capacitor that is connected between another end of the first switch and the first potential terminal; and
    a second switch that is connected between terminals of the second capacitor; and wherein
    the second serial DAC comprises:
    a third switch that has one end connected to the output end of the changeover switch;
    a third capacitor that is connected between another end of the third switch and the first potential terminal; and
    a fourth switch that is connected between terminals of the third capacitor.

11. A data driver comprising a digital-to-analog conversion circuit as set forth in claim 6.

12. A display device comprising a data driver according to claim 11.

13. A data driver comprising:
a serial-to-parallel conversion and latch circuit;
a reference voltage generation circuit;
a plurality of digital-to-analog conversion circuits;
a plurality of output switch circuits; and
a control signal generation circuit that generates control signals necessary for said serial-to-parallel conversion and latch circuit and said digital-to-analog conversion circuits,
wherein the serial-to-parallel conversion and latch circuit receives at least an input digital data signal and a control signal from the control signal generation circuit, perform conversion of serialized data to parallel data in association with an output number, performs bitwise latching, and outputs the latched data signals to said digital-to-analog conversion circuits in a bitwise manner,
wherein as the digital-to-analog conversion circuits, there are provided digital-to-analog conversion circuits corresponding to a first polarity and a second polarity, respectively,
wherein the digital-to-analog conversion circuit of the first polarity, receives first and second reference voltages generated by the reference voltage generation circuit, and converts and outputs a voltage signal of the first polarity in accordance with a data signal sequentially output bit by bit from said serial-to-parallel conversion and latch circuit, and
wherein the digital-to-analog conversion circuit of the second polarity, receives third and fourth reference voltages generated by the reference voltage generation circuit, and converts and outputs a voltage signal of the second polarity in accordance with a data signal sequentially output bit by bit from the serial-to-parallel conversion and latch circuit,
wherein the output switch circuit switches the voltage signal of the first polarity and the voltage signal of the second polarity output from the associated digital-to-analog conversion circuit, based on control signals from the control signal generation circuit, to first and second driver output terminals at prescribed timing,
wherein the digital-to-analog conversion circuit of the first polarity and the digital-to-analog conversion circuit of the second polarity each comprise the digital-to-analog conversion circuit as set forth in claim 9; and wherein
the first and second reference voltage are supplied to the first and second potential terminals of the digital-to-analog conversion circuit of the first polarity; and the third and the fourth reference voltage are supplied to the first and second potential terminals of the digital-to-analog conversion circuit of the second polarity.

14. A digital-to-analog conversion apparatus comprising:
first and second DACs (digital-to-analog converters) which alternately switch operation in such a way that one of the first and second DACs performs digital-to-analog conversion and the other one of the first and second DAC holds an analog voltage converted by the one of the first and second DACs; and
an amplifier circuit including first and second differential circuits in which switching control is performed such that, when one of the first and second differential circuits has a voltage follower configuration in which an output terminal of said digital-to-analog conversion apparatus is feedback connected to an inverting input end of said one differential circuit, a common-mode signal is supplied to an inverting input end and a non-inverting input end of the other one of the first and second differential circuits,
wherein, when one of the first and second differential circuits has a voltage follower configuration, a converted analog voltage is supplied from associated one of the first and second DACs to a non-inverting input end of said one differential circuit, and digital-to-analog conversion is carried out by the other DAC of the first and second DACs corresponding to the other one of the first and second differential circuits, an inverting input end and a non-inverting input end of the other differential circuit being supplied with a common mode signal.

15. The digital-to-analog conversion apparatus according to claim 14, wherein, when said one differential circuit has a voltage follower configuration, an output signal of the other DAC, in which digital-to-analog conversion is performed, is supplied in common to the inverting input end and the non-inverting input end of the other differential circuit, as the common mode signal.

16. An amplifying apparatus comprising:
first and second sample and hold circuits which alternately switch operation such that, when one of the first and second sample and hold circuits performs an operation of sampling an input signal, the other of the first and second sample and hold circuits performs an operation of holding the sampled signal; and
first and second differential circuits having a switching control performed such that, when one of the first and second differential circuits has a voltage follower configuration in which an output terminal of the amplifying apparatus is feedback connected to an inverting input end of said one of the first and second differential circuits, a common-mode signal is supplied to an inverting input end and a non-inverting input end of the other one of the first and second differential circuits,
wherein, when one of the first and second differential circuits has a voltage follower configuration, a signal held by an associated one of the first and second sample and hold circuits is supplied to the non-inverting input end of said one of the first and second differential circuits, and a sampling operation is performed in the other one of the first and second sample and hold circuits corresponding to the other one of the first and second differential circuits, an inverting input end and a non-inverting input end of the other one of the first and second differential circuits being supplied with a common-mode signal.

17. The amplifying apparatus according to claim 16, wherein
when said one sample and hold circuit has a voltage follower configuration, an output signal of the other sample and hold circuit in which a sampling operation is performed is supplied in common to an inverting input end and a non-inverting input end of the other one of the first and second differential circuits, as the common mode signal.

* * * * *